United States Patent
Takemura et al.

(10) Patent No.: US 7,678,200 B2
(45) Date of Patent: Mar. 16, 2010

(54) TECHNIQUE ON OZONE WATER FOR USE IN CLEANING SEMICONDUCTOR SUBSTRATE

(75) Inventors: Makoto Takemura, Tokyo (JP); Yasuo Fukuda, Tokyo (JP); Kazuaki Souda, Tokyo (JP); Masaaki Kato, Fujisawa (JP); Eiji Suhara, Ome (JP)

(73) Assignees: Sumitomo Mitsubishi Silicon Corporation, Tokyo (JP); Chlorine Engineers Corp. Ltd., Tokyo (JP); Echo Giken Co. Ltd., Tokyo (JP)

( * ) Notice: Subject to any disclaimer, the term of this patent is extended or adjusted under 35 U.S.C. 154(b) by 1208 days.

(21) Appl. No.: 10/522,717

(22) PCT Filed: Aug. 11, 2003

(86) PCT No.: PCT/JP03/10254

§ 371 (c)(1),
(2), (4) Date: Aug. 24, 2005

(87) PCT Pub. No.: WO2004/016723

PCT Pub. Date: Feb. 26, 2004

(65) Prior Publication Data

US 2006/0154837 A1 Jul. 13, 2006

(30) Foreign Application Priority Data

Aug. 13, 2002 (JP) ............................. 2002-235425

(51) Int. Cl.
*B08B 3/00* (2006.01)

(52) U.S. Cl. ............................... 134/26; 134/2; 134/42; 510/175

(58) Field of Classification Search ........................ None
See application file for complete search history.

(56) References Cited

U.S. PATENT DOCUMENTS 6,517,999 B1 * 2/2003 Oya et al. .................... 430/329
6,786,976 B1 * 9/2004 Gottschalk et al. ............ 134/10

FOREIGN PATENT DOCUMENTS

| EP | 0 997 440 A2 | 5/2000 |
| JP | 10-116809 A | 5/1998 |
| JP | 11-29795 A | 2/1999 |
| JP | 11-340182 A | 12/1999 |
| JP | 2000-37671 A | 2/2000 |
| JP | 2000-147793 A | 5/2000 |

(Continued)

*Primary Examiner*—Michael Cleveland
*Assistant Examiner*—Nicole Blan
(74) *Attorney, Agent, or Firm*—Kubovcik & Kubovcik

(57) ABSTRACT

An ultra-pure ozone water comprising an increased amount of an organic carbon capable of suppressing the reduction of the half-life period of ozone; and a method for producing the ultra-pure ozone water which comprises adding an organic solvent containing the above organic carbon to an ultra-pure ozone water containing a trace amount of the organic carbon. The above ultra-pure ozone water exhibits an increased half-life period of ozone, and thus, when used in cleaning a semiconductor substrate, allows the cleaning with an ozone water having an enhanced content of ozone, which results in exhibiting an enhanced cleaning capability and cleaning efficiency for an organic impurities, metallic impurities and the like adhered to the substrate, due to enhanced oxidizing action of ozone.

16 Claims, 5 Drawing Sheets

FOREIGN PATENT DOCUMENTS

| | | |
|---|---|---|
| JP | 2000-176265 A | 6/2000 |
| JP | 2000-331977 A | 11/2000 |
| JP | 2000-355699 A | 12/2000 |
| JP | 2002-1243 A | 1/2002 |
| JP | 2002-118085 A | 4/2002 |
| WO | 01/05702 A1 | 1/2001 |

* cited by examiner

… … …

TECHNIQUE ON OZONE WATER FOR USE IN CLEANING SEMICONDUCTOR SUBSTRATE

This application is a 371 of international application PCT/JP2003/010254, which claims priority based on Japanese patent application No. 2002-235425 filed Aug. 13, 2002, which is incorporated herein by reference.

FIELD OF THE INVENTION

The present invention relates to a technique on ozone water for use in cleaning semiconductor substrates and more particularly to a technique on ozone water for use in cleaning semiconductor substrates, which can prevent such a phenomenon associated with the cleaning of the semiconductor substrates using the ozone water that a ozone concentration in the ozone water is decreased seriously in the course of an injection of the ozone water from a cleaning nozzle onto the semiconductor substrate.

DESCRIPTION OF THE PRIOR ART

Ozone water has recently drawn attention in the field of manufacturing processes for semiconductor substrates. The reason for this is because the ozone water can induce a strong oxidative reaction and also advantageously a resultant product from decomposition thereof is oxygen that may help simplify a waste water treatment after the cleaning of the semiconductor substrates. The ozone water has been employed in some applications, including a removal of organic compounds and metallic impurities adhering to the surfaces of the semiconductor substrates and an oxidation of the semiconductor substrates.

Besides, the circumstances today require the semiconductor substrates having high level of cleanliness. To meet this need, an ultra-pure water having an extremely high purity has been commonly employed as a cleaning water used in cleaning the substrates. The ultra-pure water is defined as the water containing not only particles and metallic impurities but also TOC (Total Organic Carbon) amount reduced significantly. One method for reducing the total organic carbon amount is known, in which an ultraviolet ray is irradiated to the ultra-pure water to decompose and thus remove the amount of organic carbon contained in the ultra-pure water (i.e., carbon atoms contained in the organic compound).

It is to be noted in this regard that a concentration of the ozone dissolved in the water (hereinafter referred to as a dissolved ozone concentration) is decreased over time due to an ozone diffusion into the atmosphere, an ozone autolysis and the like, except a case that the ozone in itself is consumed in a chemical reaction. The half-life period of ozone is known as an index to indicate the reduction in the dissolved ozone concentration over time. This represents a time period required for an amount of ozone dissolved in the water to decrease by half. Although it is affected by an area of liquid surface (a vapor-liquid contact area) and the likes, typically the half-life period of ozone in the pure water is in a range of 10 to 30 minutes. When the pure water is held in a vessel having a large opening, such as a cleaning bath, the half-life period of ozone is typically in a range of 2 to 5 minutes.

There have been three known methods according to the prior art for extending the half-life period of ozone, as will be described below. Those are: (1) reducing a distance from an ozone dissolving section for dissolving an ozone gas into an ultra-pure water to a use-point in a cleaning apparatus where an ozone water is used, such as a spray nozzle for spraying a cleaning water over a semiconductor substrate, for example; (2) extending a process time of the ozone water in the cleaning apparatus; and (3) introducing such an ozone wafer producing apparatus that can produce the ozone water having as several or some ten times high dissolved ozone concentration as that usually required in the cleaning of semiconductor substrates.

The method characterized in (1) reducing the path to be used can be easily embodied. For example, it is contemplated to employ a direct bubbling of the ozone gas into the cleaning bath so as to obtain the ozone water. However, in this method, the highly concentrated ozone water could not be obtained and inevitably no enhanced cleaning capability on the semiconductor substrates could be expected.

As for the method characterized in (2) extending the process time, the cleaning processing ability of the cleaning apparatus could be deteriorated. Further, the method characterized in (3) producing the ozone water having the concentration greater than what is required would need an ozone water producing apparatus of large capacity. Consequently, the methods defined in (2) and (3) could lead to an equipment cost increase.

On the other hand, the inventors of the present invention have made a research on the half-life period of ozone particularly on an ozone water comprising an ultra-pure water containing ozone (hereinafter referred to as an ultra-pure ozone water). As a result, the inventors have reached the finding that the half-life period of ozone of the ultra-pure ozone water is significantly short as compared to that of the conventional ozone water using a pure water and consequently using the ultra-pure ozone water could not provide sufficient cleaning performance of the semiconductor substrates.

Based on this finding, the inventors have made an investigation to find an exact factor affecting the serious drop in the half-life period of zone of the ultra-pure ozone water. Ultimately, they have realized that an amount of organic carbon in the water that can suppress the autolysis of ozone is decomposed by an ultraviolet ray that has been irradiated during the production of the ultra-pure water, which consequently facilitates the autolysis of ozone in the ultra-pure ozone water.

Taking this into account, the inventors have made a further enthusiastic research and finally reached the finding that adding an amount of organic solvent containing an organic carbon to the ultra-pure ozone water is extremely effective in suppressing the reduction of the half-life period of ozone.

They have found further in this regard that the amount of the organic solvent to be added should be a very trace amount but with the organic solvent added by an amount more than what is required, the organic carbon in the organic solvent will be left on a surface of the semiconductor substrate, leading to the deterioration of quality of the semiconductor substrate. Based on this finding, the inventors have also reviewed a method for adding the trace amount of organic solvent to the ultra-pure ozone water. As a result, it has been proved that adding the organic carbon in the organic solvent to the ultra-pure ozone water by using a porous polymer membrane having water repellency is effective.

Accordingly, an object of the present invention is to provide an ozone water having a reduced total organic carbon amount, especially an ozone water for use in cleaning semiconductor substrates characterized in that the reduction of the half-life period of ozone of an ozone water obtained from an ultra-pure water having an extremely small total organic carbon amount can be suppressed (i.e., the half-life period of ozone can be extended) so as to enhance a cleaning capability and a cleaning efficiency on the semiconductor substrates, a production method of the same ozone water and a cleaning method of semiconductor substrates using the same.

Another object of the present invention is to provide a production method of an ozone water for use in cleaning semiconductor substrates, which allows a trace amount of organic solvent to be accurately added to water, and a cleaning method of the semiconductor substrates using the same.

SUMMERY OF THE INVENTION

A first invention provides an ozone water for use in cleaning semiconductor substrates, comprising water containing an amount of ozone, in which said water has been added with an organic solvent containing an amount of organic carbon capable of suppressing a reduction of the half-life period of ozone.

As for the semiconductor substrate to be cleaned, for example, a silicon wafer and a gallium arsenide wafer may be employed. The semiconductor substrate may be a single substrate or a bonded substrate comprising two pieces of semiconductor substrates that have been bonded in one on the other. It is to be noted that the semiconductor substrate implies a semiconductor substrate that is mounted with semiconductor devices (e.g., LSI, VLSI and ULSI).

As for the water containing the ozone, for example, a pure water and an ultra-pure water may be employed.

As for the organic solvent, such an organic solvent may be preferable that is highly dissolvable into the water, readily available as an inexpensive and highly-purified organic solvent product (with the metallic impurities concentration not greater than 0.5 ppb) and especially has a profound effect on extending the half-life period of ozone. Specifically, the preferable organic solvent may include alcohol, especially, ethanol and isopropyl alcohol.

The amount of the organic solvent to be added is not limited. However, preferably, an addition amount sufficient to exhibit the cleaning effect on the semiconductor substrate should be used, for example, some µg/liter. This is because a large amount of organic solvent added could allow an amount of organic carbon to remain on a surface of the semiconductor substrate after cleaning, leaning to the deteriorated characteristics of the substrate. Further, there is a fear of an inverse effect to shorten the half-life period of ozone from the fact that the ozone should be consumed to decompose any excessive organic carbon added.

A detailed mechanism of the organic carbon acting to suppress the autolysis of the ozone has not been made clear. However, it is apparent from the test data on Table 1, for example, that the addition of the organic solvent containing an amount of organic carbon can somehow help increase the total organic carbon amount in the ozone water that has been once reduced. It is considered from the above reason that the addition of the organic solvent should be quite effective to extend the half-life period of ozone of the ozone water whose total organic carbon amount has been reduced.

A second invention provides an ozone water for use in cleaning semiconductor substrates in accordance with the first invention, in which the amount of said organic solvent to be added is in a range of 0.1 µg/liter to 0.1 g/liter.

The amount of added organic solvent smaller than 0.1 µg/liter could not satisfactorily suppress the reduction of the half-life period of ozone. In contrast, if the amount of the organic solvent to be added is over 0.1 g/liter, the carbon contents could remain on the surface of the semiconductor substrate, and those remaining carbon contents could deteriorate the characteristics of the substrate (e.g., the electrical characteristics) and/or inversely consume the ozone to thus shorten the half-life period of ozone. A specifically preferred addition amount of organic solvent is in a range of 5 µg/liter to 1 mg/liter. With the addition amount within this range, the dissolved ozone concentration is not reduced substantially and advantageously no organic carbon remains on the surface of the semiconductor substrate, thus providing no fear of the deteriorated characteristics thereof after cleaning.

A third invention provides an ozone water for use in cleaning semiconductor substrates in accordance with the first or the second invention, in which said organic solvent is ethanol or isopropyl alcohol.

A fourth invention provides an ozone water for use in cleaning semiconductor substrates in accordance with the first or the second invention, in which said water is an ultra-pure water.

The ultra-pure water referred herein implies the water having the metallic impurities concentration not greater than 0.5 ppb. The total organic carbon amount in the ultra-pure water is no higher than $5.0 \times 10^{13}$ atoms/cm$^3$.

A fifth invention provides an ozone water for use in cleaning semiconductor substrates in accordance with the third invention, in which said water is an ultra-pure water.

A sixth invention provides a production method of an ozone water for use in cleaning semiconductor substrates, comprising: an ozone water production step for dissolving an ozone gas in water to produce an ozone water; and a solvent adding step for adding an organic solvent containing an amount of organic carbon capable of suppressing the reduction of the half-life period of ozone to said water.

As for the semiconductor substrate to be cleaned, for example, a silicon wafer and a gallium arsenide wafer may be employed. The semiconductor substrate may be a single substrate or a bonded substrate comprising two pieces of semiconductor substrates that have been bonded in one on the other.

As for the water containing the ozone, for example, a pure water and an ultra-pure water may be employed.

As for the organic solvent, such an organic solvent may be preferable that is highly dissolvable into the water, readily available as an inexpensive and highly-purified organic solvent product (with the metallic impurities concentration not greater than 0.5 ppb) and especially has a profound effect on extending the half-life period of ozone. Specifically, the preferable organic solvent may include alcohol, especially, ethanol and isopropyl alcohol.

The amount of the organic solvent to be added is not limited. However, preferably, an addition amount sufficient to exhibit the cleaning effect on the semiconductor substrate and most preferably, a minimum amount thereof should be used. This is because a large amount of organic solvent added could allow an amount of organic carbon to remain on a surface of the semiconductor substrate after cleaning, leaning to the deteriorated characteristics of the substrate. Further, there is a fear of an inverse effect to shorten the half-life period of ozone from the fact that the ozone should be consumed to decompose any excessive organic carbon added.

The method used to generate the ozone gas may not be limited. The method may employ, for example, the silent discharge process in which ozone is generated from oxygen gas or the electrolytic process in which water is electrolyzed to generate ozone. The above description about the fact that the ultra-pure water processed with the ultraviolet ray irradiation, if used, induces the reduced half-life period of ozone may also apply to either of the generation methods.

The method of adding the organic solvent to the water may not be limited. However, in order to avoid the deterioration in characteristics of the semiconductor substrate resultant from a large addition amount of organic solvent, such a method should not be applied that employs a commonly used weighing preparation method for adding the organic solvent. Therefore, preferably the addition method using a porous polymer membrane having water repellency may be used.

According to the sixth invention, the addition of the organic solvent to the water allows the ozone water whose total organic carbon amount having been increased to be obtained. That is, there is an amount of organic carbon in the organic solvent, and adding the amount of organic carbon to the water can increase the total organic carbon amount in the ozone water. Consequently, with the aid of the added organic solvent, even the ozone water whose total organic carbon amount having been reduced still can extend the half-life period of ozone.

A seventh invention provides a production method of an ozone water for use in cleaning semiconductor substrates in accordance with the sixth invention, in which the amount of said organic solvent to be added is in a range of 0.1 μg/liter to 0.1 g/liter.

The amount of added organic solvent smaller than 0.1 μg/liter could not satisfactorily suppress the reduction of the half-life period of ozone. In contrast, if the amount of the organic solvent to be added is over 0.1 g/liter, the carbon contents could remain on the surface of the semiconductor substrate, and those remaining carbon contents could deteriorate the characteristics of the substrate and/or inversely consume the ozone to thus shorten the half-life period of ozone. A specifically preferred addition amount of organic solvent is in a range of 5 μg/liter to 1 mg/liter. With the addition amount within this range, the dissolved ozone concentration is not reduced substantially and advantageously no organic carbon remains on the surface of the semiconductor substrate, thus providing no fear of the deteriorated characteristics thereof after cleaning.

An eighth invention provides a production method of an ozone water for use in cleaning semiconductor substrates in accordance with the sixth or the seventh invention, in which said organic solvent is ethanol or isopropyl alcohol.

A ninth invention provides a production method of an ozone water for use in cleaning semiconductor substrates in accordance with the sixth or the seventh invention, in which said water is an ultra-pure water.

The ultra-pure water referred herein implies the water having the metallic impurities concentration not greater than 0.5 ppb. The total organic carbon amount in the ultra-pure water is no higher than $5.0 \times 10^{13}$ atoms/cm$^3$.

A tenth invention provides a production method of an ozone water for use in cleaning semiconductor substrates in accordance with the eighth invention, in which said water is an ultra-pure water.

An eleventh invention provides a production method of an ozone water for use in cleaning semiconductor substrates in accordance with either of the sixth, the seventh or the tenth invention, in which said ozone is obtained by the silent discharge process in which ozone is generated from an oxygen gas or by the electrolytic process in which water is electrolyzed to generate ozone.

According to the eleventh invention, if the silent discharge process is employed, for example, the ozone generated from the oxygen gas is dissolved in the water. The water may be such water that has been previously added with the organic solvent.

Further, if the electrolytic process is employed, the water is electrolyzed to thereby generate the ozone. In this case, the ultra-pure water can be utilized not only as a solvent medium but also as a source material of the ozone gas. Owing to this, if the ultra-pure water that is to be electrolyzed is previously added with the organic solvent, then the reduction of the half-life period of ozone for the ozone gas could be suppressed effectively from the time of generation of the ozone.

A twelfth invention provides a production method of an ozone water for use in cleaning semiconductor substrates in accordance with the eight invention, in which said ozone is obtained by the silent discharge process in which ozone is generated from an oxygen gas or by the electrolytic process in which water is electrolyzed to generate ozone.

A thirteenth invention provides a production method of an ozone water for use in cleaning semiconductor substrates in accordance with the ninth invention, in which said ozone is obtained by the silent discharge process in which ozone is generated from an oxygen gas or by the electrolytic process in which water is electrolyzed to generate ozone.

A fourteenth invention provides a production method of an ozone water for use in cleaning semiconductor substrates in accordance with either of the sixth, the seventh, the tenth, the twelfth or the thirteenth invention, in which said adding step for adding said organic solvent to the water is performed through a porous polymer membrane having water repellency.

The porous polymer membrane generally refers to a membrane made of synthetic resin that allows a gas to pass therethrough but not a liquid. Accordingly, if the ultra-pure water and the organic solvent are separated from each other by the porous polymer membrane placed therebetween, the organic solvent can be added to the ultra-pure water by an extremely trace amount at a time through the porous polymer membrane. Specifically, the organic solvent is disposed in a primary side of the porous polymer membrane and the ultra-pure water is supplied to a secondary side of the membrane, respectively. This arrangement allows the organic solvent in the primary side to infiltrate into the ultra-pure water in the secondary side through the porous polymer membrane.

Preferably, the material of the porous polymer membrane may be a fluorinated synthetic resin from the consideration of corrosion resistance, weather resistance and a risk of elution of impurities from the filter in itself. Specifically, such a porous polymer membrane may be employed, which is made of membrane material of polytetrafluoroethylene resin (PTFE) reinforced with a net made of tetrafluoroethylene-perfluoroalkylvinyl ether copolymer resin (PFA).

A fifteenth invention provides a production method of an ozone water for use in cleaning semiconductor substrates in accordance with the eighth invention, in which said adding step for adding said organic solvent to the water is performed through a porous polymer membrane having water repellency.

A sixteenth invention provides a production method of an ozone water for use in cleaning semiconductor substrates in accordance with the ninth invention, in which said adding step for adding said organic solvent to the water is performed through a porous polymer membrane having water repellency.

A seventeenth invention provides a production method of an ozone water for use in cleaning semiconductor substrates in accordance with the eleventh invention, in which said adding step for adding said organic solvent to the water is performed through a porous polymer membrane having water repellency.

An eighteenth invention provides a cleaning method of semiconductor substrates comprising: an ozone water production step for dissolving an ozone gas in water to produce an ozone water; a solvent adding step for adding an organic solvent containing an amount of organic carbon capable of suppressing the reduction of the half-life period of ozone to said water; and a cleaning step for cleaning a semiconductor substrate with said ozone water added with said organic solvent.

As for the semiconductor substrate to be cleaned, for example, a silicon wafer and a gallium arsenide wafer may be employed. The semiconductor substrate may be a single substrate or a bonded substrate comprising two pieces of semiconductor substrates that have been bonded in one on the other.

As for the water containing the ozone, for example, a pure water and an ultra-pure water may be employed.

As for the organic solvent, such an organic solvent may be preferable that is highly dissolvable into the water, readily available as an inexpensive and highly-purified organic solvent product (with the metallic impurities concentration not greater than 0.5 ppb) and especially has a profound effect on extending the half-life period of ozone. Specifically, the preferable organic solvent may include alcohol, especially, ethanol and isopropyl alcohol.

The amount of the organic solvent to be added is not limited. However, preferably, an addition amount sufficient to exhibit the cleaning effect on the semiconductor substrate and most preferably, a minimum amount thereof should be used. This is because a large amount of organic solvent added could allow an amount of organic carbon to remain on a surface of the semiconductor substrate after cleaning, leaning to the deteriorated characteristics of the substrate. Further, there is a fear of an inverse effect to shorten the half-life period of ozone from the fact that the ozone should be consumed to decompose any excessive organic carbon added.

The method used to generate the ozone gas may not be limited. The method may employ, for example, the silent discharge process in which ozone is generated from oxygen gas or the electrolytic process in which water is electrolyzed to generate ozone. The above description about the fact that the ultra-pure water processed with the ultraviolet ray irradiation, if used, induces the reduced half-life period of ozone may also apply to either of the generation methods.

The method of adding the organic solvent to the water may not be limited. However, in order to avoid the deterioration in characteristics of the semiconductor substrate resultant from a large addition amount of organic solvent, such a method should not be applied that employs a commonly used weighing preparation method for adding the organic solvent. Therefore, preferably the addition method using a porous polymer membrane having water repellency may be used.

As for the cleaning method, a dipping method may be employed in which the produced cleaning fluid containing the ozone is stored in a cleaning bath and one or more pieces of the semiconductor substrates may be dipped into the cleaning fluid in the cleaning bath. Then, owing to a strong oxidizing power of the ozone, organic matters and metallic impurities are decomposed and removed from the semiconductor substrates. Further, the ozone concentration in the cleaning fluid can be maintained at a high level until the cleaning fluid finally reaches the cleaning bath. This can help reduce a required cleaning time as compared to the prior art method.

In an alternative cleaning method, for example, a spin cleaning may be employed. In the spin cleaning method, the semiconductor substrate is rotated, as it is placed on a table or held in a holding jig, while the cleaning fluid containing the ozone being injected over the semiconductor substrate. If this method is employed, the semiconductor substrate can be cleaned satisfactorily in a short time.

In this invention, preferably, the length of a ozone water supply path defined from an ozone gas production unit to an ozone dissolving unit for dissolving the ozone gas in the water and also the length of another ozone water supply path defined from the ozone dissolving unit to a cleaning unit of the semiconductor substrate may be constructed and set such that they could be as short as possible. This may further enhance the cleaning capability as well as the cleaning efficiency on the semiconductor substrates, owing to its synergistic effect with the suppressing effect on the reduction of the half-life period of ozone in the cleaning fluid containing the ozone.

According to the eighteenth invention, the addition of the organic solvent to the water allows the ozone water whose total organic carbon amount having been increased to be obtained. That is, since there is an amount of organic carbon contained in the organic solvent, adding a certain amount of organic solvent to the water can increase the total organic carbon amount in the ozone water. Consequently, with the aid of the added organic solvent, even the ozone water whose total organic carbon amount has been once reduced still can extend the half-life period of ozone. Thus obtained ozone water is used for the cleaning fluid and it serves as the ozone contained cleaning fluid to clean the semiconductor substrates. This ozone contained cleaning fluid provides an excellent cleaning capability in cleaning of the semiconductor substrates.

A nineteenth invention provides a cleaning method of semiconductor substrates in accordance with the eighteenth invention, in which the amount of said organic solvent to be added is in a range of 0.1 µg/liter to 0.1 g/liter.

The amount of added organic solvent smaller than 0.1 µg/liter could not satisfactorily suppress the reduction of the half-life period of ozone. In contrast, if the amount of the organic solvent to be added is over 0.1 g/liter, the carbon contents could remain on the surface of the semiconductor substrate, and those remaining carbon contents could deteriorate the characteristics of the substrate and/or inversely consume the ozone to thus shorten the half-life period of ozone. A specifically preferred addition amount of organic solvent is in a range of 5 µg/liter to 1 mg/liter. With the addition amount within this range, the dissolved ozone concentration is not reduced substantially and advantageously no organic carbon remains on the surface of the semiconductor substrate, thus providing no fear of the deteriorated characteristics thereof after cleaning.

A twentieth invention provides a cleaning method of semiconductor substrates in accordance with the eighteenth or the nineteenth invention, in which said organic solvent is ethanol or isopropyl alcohol.

A twenty-first invention provides a cleaning method of semiconductor substrates in accordance with the eighteenth or the nineteenth invention, in which said water is an ultra-pure water.

The ultra-pure water referred herein implies the water having the metallic impurities concentration not greater than 0.5 ppb. The total organic carbon amount of the ultra-pure water is no higher than $5.0 \times 10^{13}$ atoms/cm$^3$.

A twenty-second invention provides a cleaning method of semiconductor substrates in accordance with the twentieth invention, in which said water is an ultra-pure water.

A twenty-third invention provides a cleaning method of semiconductor substrates in accordance with either of the eighteenth, the nineteenth or the twenty-second invention, in which said ozone is obtained by the silent discharge process in which ozone is generated from an oxygen gas or by the electrolytic process in which water is electrolyzed to generate ozone.

According to the twenty-third invention, if the silent discharge process is employed, for example, the ozone generated from the oxygen gas is dissolved in the water. The water may be such water that has been previously added with the organic solvent.

Further, if the electrolytic process is employed, the water is electrolyzed to thereby generate the ozone. In this case, the ultra-pure water can be utilized not only as a solvent medium but also as a source material of the ozone gas. Owing to this, if the ultra-pure water that is to be electrolyzed is previously added with the organic solvent, then the reduction of the half-life period of ozone for the ozone gas could be suppressed effectively from the time of generation of the ozone.

A twenty-fourth invention provides a cleaning method of semiconductor substrates in accordance with the twentieth invention, in which said ozone is obtained by the silent discharge process in which ozone is generated from an oxygen gas or by the electrolytic process in which water is electrolyzed to generate ozone.

A twenty-fifth invention provides a cleaning method of semiconductor substrates in accordance with the twenty-first invention, in which said ozone is obtained by the silent discharge process in which ozone is generated from an oxygen gas or by the electrolytic process in which water is electrolyzed to generate ozone.

A twenty-sixth invention provides a cleaning method of semiconductor substrates in accordance with either of the eighteenth, the nineteenth, the twenty-second, the twenty-fourth or the twenty-fifth invention, in which said adding step for adding said organic solvent to the water is performed through a porous polymer membrane having water repellency.

The porous polymer membrane generally refers to a membrane made of synthetic resin that allows a gas to pass therethrough but not a liquid. Accordingly, if the ultra-pure water and the organic solvent are separated from each other by the porous polymer membrane placed therebetween, the organic solvent can be added to the ultra-pure water by an extremely trace amount at a time through the porous polymer membrane. Specifically, the organic solvent is disposed in a primary side of the porous polymer membrane and the ultra-pure water is supplied to a secondary side of the membrane, respectively. This arrangement allows the organic solvent in the primary side to infiltrate into the ultra-pure water in the secondary side through the porous polymer membrane.

Preferably, the material of the porous polymer membrane may be a fluorinated synthetic resin from the consideration of corrosion resistance, weather resistance and a risk of elution of impurities from the filter in itself. Specifically, such a porous polymer membrane may be employed, which is made of membrane material of polytetrafluoroethylene resin (PTFE) reinforced with a net made of tetrafluoroethyleneperfluoroalkylvinyl ether copolymer resin (PFA).

A twenty-seventh invention provides a cleaning method of semiconductor substrates in accordance with the twentieth invention, in which said adding step for adding said organic solvent to the water is performed through a porous polymer membrane having water repellency.

A twenty-eighth invention provides a cleaning method of semiconductor substrates in accordance with the twenty-first invention, in which said adding step for adding said organic solvent to the water is performed through a porous polymer membrane having water repellency.

A twenty-ninth invention provides a cleaning method of semiconductor substrates in accordance with the twenty-third invention, in which said adding step for adding said organic solvent to the water is performed through a porous polymer membrane having water repellency.

DESCRIPTION OF THE PREFERRED EMBODIMENTS

Preferred embodiments of the present invention will now be described in detail with reference to the attached drawings. It is to be noted that the present invention is not limited to those embodiments. Referring now to FIGS. 1 to 4, a first embodiment of the present invention will be described.

Figure 1:
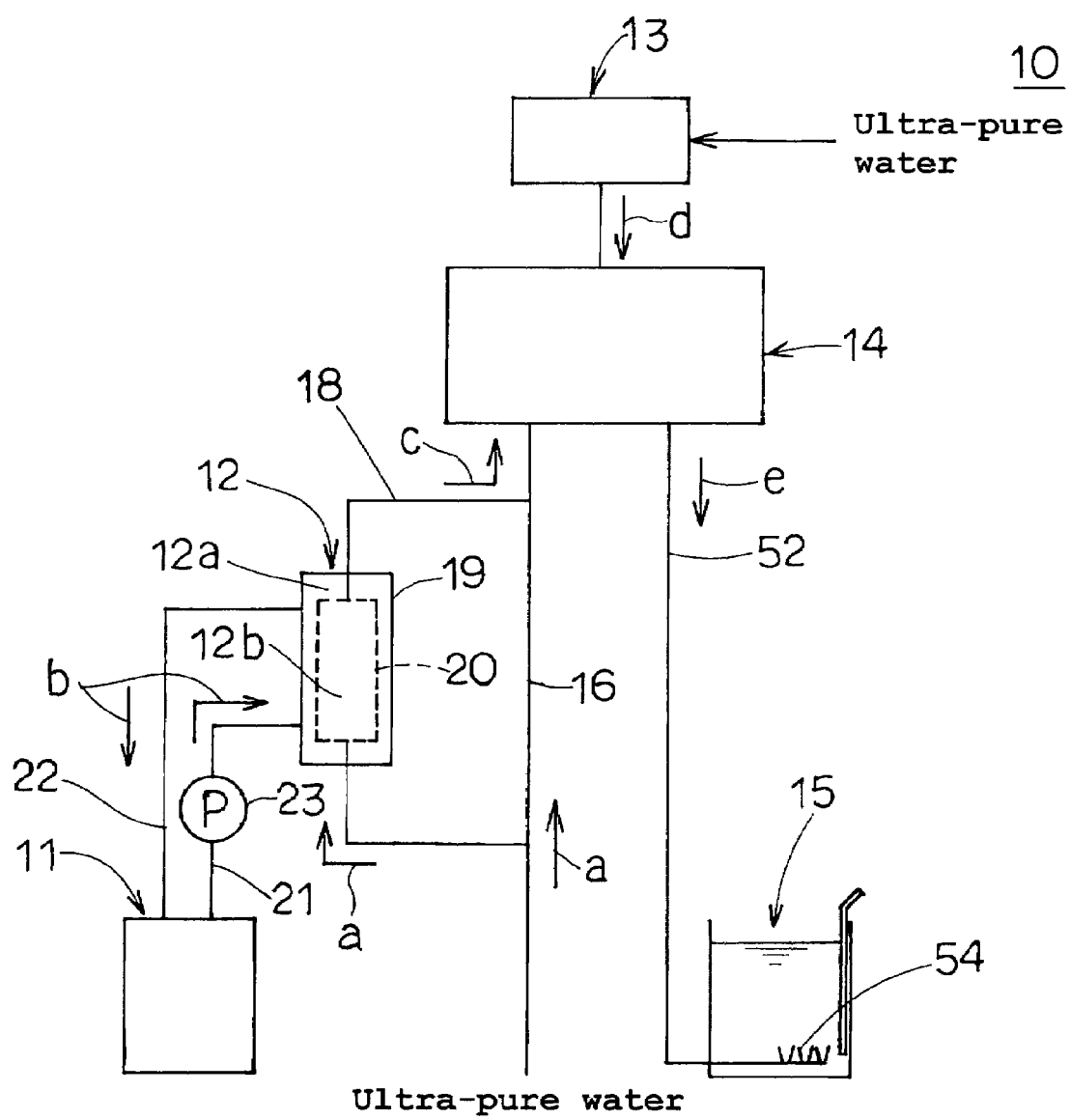
FIG. 1 is a block diagram of a semiconductor substrate cleaning apparatus according to a first embodiment of the present invention.

In FIG. 1, reference numeral 10 generally designates a semiconductor substrate cleaning apparatus according to a first embodiment of the present invention, which comprises a solvent tank 11 for storing an organic solvent "b" containing an amount of organic carbon, a solvent adding unit 12 for adding the organic solvent "b" to an ultra-pure water "a", an ozone gas production unit 13 for generating an ozone gas "d" from the ultra-pure water, an ozone water production unit 14 for dissolving the ozone gas "d" in the solvent added ultra-pure water "c" that has been added with the organic solvent "b" to thereby generate an ultra-pure ozone water (i.e., an ozone water for use in cleaning semiconductor substrates) "e", and a cleaning bath 15 for cleaning the semiconductor substrate with the ultra-pure ozone water "e".

Respective components of the semiconductor substrate cleaning apparatus 10 will now be described in detail.

The organic solvent "b" containing an amount of organic carbon is stored in the solvent tank 11. The organic solvent "b" used herein is isopropyl alcohol having the metallic impurities concentration not greater than 0.5 ppb. Instead of the isopropyl alcohol, ethanol may be employed. The organic solvent "b" has been previously mixed and thus diluted with the ultra-pure water "a". This previous preparation has been done because the isopropyl alcohol in stock solution has the concentration that is too high to be used in adding the organic solvent "b" by as trace amount as some μg/liter to the ultra-pure water. The ultra-pure water "a" has been irradiated with an ultraviolet ray and its total organic carbon amount has been reduced as low as $5.0 \times 10^{13}$ atoms/cm$^3$.

The ultra-pure water "a" is supplied to the ozone water production unit 14 through an ultra-pure water supply line 16.

To the middle portions of the ultra-pure water supply line 16 is connected a bypass pipe 18 which in turn passes through the solvent adding unit 12. That is, a portion of the ultra-pure water "a" flowing through the ultra-pure water supply line 16 may be supplied to the solvent adding unit 12.

The solvent adding unit 12 comprises an enclosed cell 19 and a porous polymer membrane filter 20 having an enclosed vessel shape fitted in the cell 19 with a space placed therebetween. The porous polymer membrane filter 20 comprises a water repellent membrane material made of polytetrafluoroethylene resin (PTFE) which has been reinforced with a net made of tetrafluoroethylene-perfluoroalkylvinyl ether copolymer resin (PFA). The space between the cell 19 and the porous polymer membrane filter 20 defines a primary chamber 12a of the solvent adding unit 12. The primary chamber 12a is supplied with the organic solvent "b" stored in the solvent tank 11. On the other hand, an inner space within the porous polymer membrane filter 20 defines a secondary chamber 12b of the solvent adding unit 12. The secondary chamber 12b is supplied with the ultra-pure water "a" from an external source.

One end of an outer shell of the cell 19 and the solvent tank 11 are connected by a solvent supply pipe 21 so as to make a communication therebetween. Further, the other end of the outer shell of the cell 19 and the solvent tank 11 are connected by a solvent discharge pipe 22 so as to make a communication therebetween. A pump 23 is disposed in an intermediate location of the solvent supply pipe 21. In operation, the pump 23 supplies the organic solvent "b" from the solvent tank 11 into the primary chamber 12a stably and intermittently, and then through the solvent discharge pipe 22 back to the solvent tank 11. During this cycle, in the primary chamber 12a, a portion of the organic solvent "b" passes through the porous polymer membrane filter 20 to be added to the ultra-pure water "a" in the secondary chamber 12b. If the isopropyl alcohol in stock solution is used, a permeation amount (added amount) of the organic solvent "b" is some hundred μg/liter. If a smaller amount as minute as some μg/liter of isopropyl alcohol is to be added, the isopropyl alcohol may be diluted in advance in an alcohol diluting bath.

The ozone gas production unit 13 will now be described in detail with reference to FIG. 2.

Figure 2:
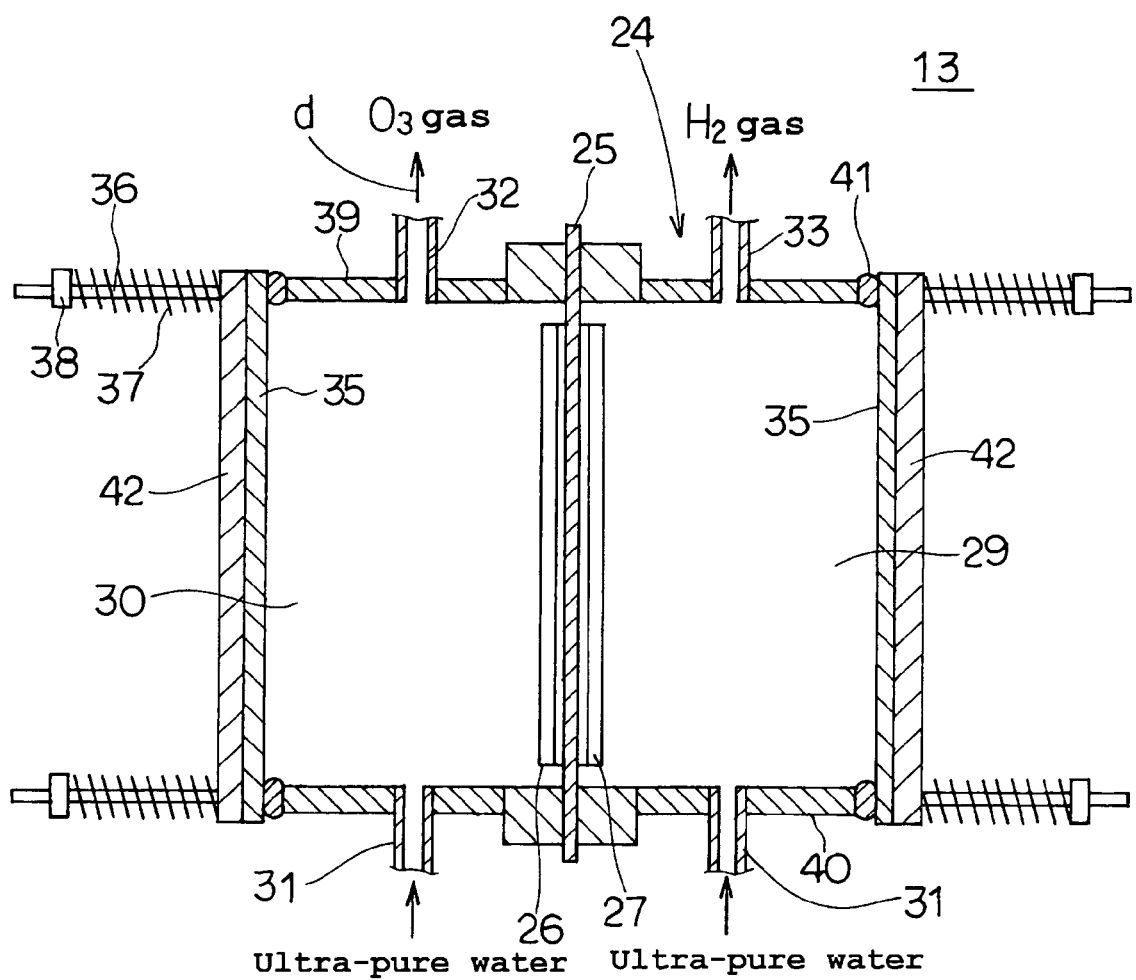
FIG. 2 is a longitudinal sectional view of an ozone gas production unit employed in the semiconductor substrate cleaning apparatus according to the first embodiment of the present invention.

As shown in FIG. 2, the ozone gas production unit 13 is an electrolytic ozone gas production unit and comprises an electrolytic bath 24. The electrolytic bath 24 is made of Teflon (trademark of Dupont) and defines an enclosed bath having a horizontally elongated rectangular shape in section. The electrolytic bath 24 has a pair of side walls 35, 35, a top wall 39 and a bottom wall 40.

An ion exchange membrane 25 is disposed in a central location of the electrolytic bath 24, which partitions an interior space of the electrolytic bath 24 into a cathode chamber 29 and an anode chamber 30. The ion exchange membrane 25 is a cation exchange membrane. A porous anode electrode 26 made of titanium carrying a lead-oxide catalyst thereon and having vapor-liquid permeability covering across the membrane adheres to the ion exchange membrane 25 in the anode chamber 30 side. Further, a cathode electrode 27 made of carbon carrying platinum thereon, which has a diameter in a range of 10 μm to 20 μm and a thickness of 100 μm, adheres to the ion exchange membrane 25 in the cathode chamber 29 side.

The cathode electrode 27 is connected with a collector made of zirconium, though not shown.

Further, the cathode chamber 29 and the anode chamber 30 are in communication with flow pipes 31, 31, respectively. Respective flow pipes 31 supply the ultra-pure water to the cathode chamber 29 and the anode chamber 30, respectively. Instead of the ultra-pure water, the above-mentioned solvent added ultra-pure water "c" may be employed. This would enhance the suppressing effect on the reduction of the half-life period of ozone in the ultra-pure ozone water "e".

Power supply is connected to the cathode electrode 27 and the anode electrode 26 respectively to thus allow the current to flow through the ultra-pure water. The anode chamber 30 is communicated with an ozone gas exhaust pipe 32 to deliver the ozone gas ($O_3$ gas) "d" generated by the anode electrode 26 to the ozone water production unit 14. Further, the cathode chamber 29 is communicated with a hydrogen gas exhaust pipe 33 to exhaust a hydrogen gas ($H_2$ gas) generated by the cathode electrode 27.

The opposite side walls 35, 35 of the electrolytic bath 24 are pressed at their both ends by a predetermined bias force against both ends of the top and bottom walls 39, 40, respectively, with seal members 41 . . . made of rubber placed therebetween. This pressing force is exerted by each of a pair of pressing plates 42, 42 abutting on an exterior surface of the each side wall 35. A pair of rods 36 protrude from the exterior surface in both ends of each of the pressing plates 42, 42. Each of the rods 36 . . . extends through a through hole with play, which is formed in a corresponding guide member 38. Each of the rods 36 . . . is equipped with a coil spring 37 on its outer side between the guide members 38 and the side wall 35.

A bias force from each spring 37 presses the pressing plate 42 against each side wall 35 by the predetermined bias force. If any excessive amount of ultra-pure water is supplied to the cathode chamber 29 and the anode chamber 30, both side walls 35, 35 are moved outward against the spring forces from respective coil springs 37 . . . , thereby to allow the excessive pure-water to run out through the space between both ends of both side walls 35, 35 and the seal members 41 . . . . This can prevent the ion exchange membrane 25 from being damaged by the excessive amount of pure-water.

Then the ozone water production unit 14 will now be described with reference to FIGS. 3 and 4.

Figure 3:
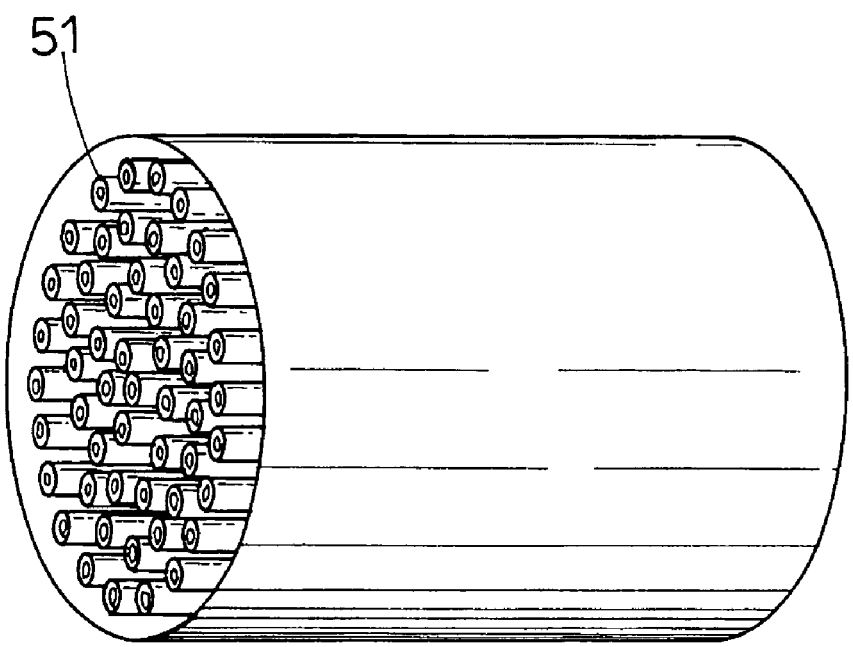
FIG. 3 is a perspective view of an ozone gas production unit employed in the semiconductor substrate cleaning apparatus according to the first embodiment of the present invention.
Figure 4:
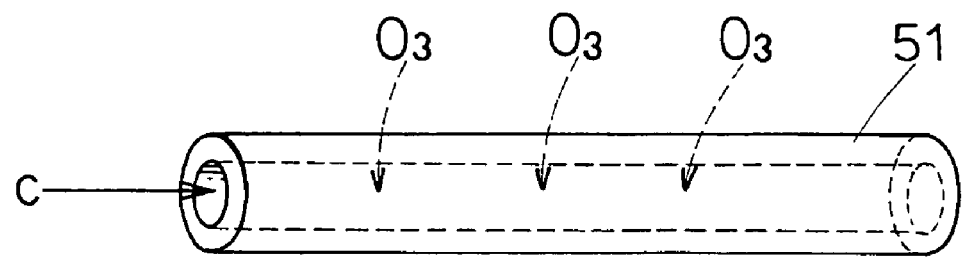
FIG. 4 is a perspective view of hollow fiber module incorporated in the ozone production unit of FIG. 3.

As shown in FIG. 3, the ozone water production unit 14 has a cylindrical configuration and includes a plurality of hollow fiber modules 51 with respective axial lines spaced in parallel from each other. The hollow fiber module 51 has an elongated hollow body made of tetrafluoroethylene resin having a diameter in a range of 0.001 mm to 0.01 mm and a length not shorter than 1000 mm, as shown in FIG. 4. This configuration of the hollow fiber modules 51 each being made of tetrafluoroethylene resin allows a portion of the ozone gas "d" flowing externally to permeate into its tubular body. Owing to this, when the solvent added ultra-pure water "c" is introduced through the hollow fiber module 51 with the outside region of the hollow fiber module 51 filled with an atmosphere of the ozone gas "d", then the solvent added ultra-pure water "c" flowing through the hollow fiber module 51 turns to form the ultra-pure ozone water "e" containing the ozone gas "d" that has been dissolved therein.

Then, thus obtained ultra-pure ozone water "e" is delivered through an ozone water supply pipe 52 with the aid of a feed force from a supply source and supplied from a discharge nozzle 54 disposed in the bottom of the cleaning bath 15 into the cleaning bath 15.

The description will be now directed to an ozone cleaning method of semiconductor substrate using the semiconductor substrate cleaning apparatus 10 of the first embodiment.

The ultra-pure water "a" is supplied from the ultra-pure water supply line 16 to the ozone water production unit 14 at a flow rate of 10 liter/min. However, a portion thereof flows into the bypass pipe 18 at a flow rate of 1-2 liter/min and is supplied to the secondary chamber 12b of the solvent adding unit 12. On the other hand, the primary chamber 12a of the solvent adding unit 12 is supplied with a portion of the organic solvent "b" from the solvent tank 11 at a flow rate of about 5 liter/min by the operation of the pump 23. With this condition, in the solvent adding unit 12, a portion of the organic solvent "b" in the primary chamber 12a can permeate through the porous polymer membrane filter 20 into the secondary chamber 12b. Thus, a trace amount of organic solvent "b" is added to the ultra-pure water "a" to form the solvent added ultra-pure water "c". The amount of the organic solvent "b" to be added is approximately some hundred μg/liter.

After that, the solvent added ultra-pure water "c" that has been added with the organic solvent "b" is returned from the bypass pipe 18 to the ultra-pure water supply line 16 in its downstream section and then supplied to the ozone water production unit 14.

On the other hand, the ozone water production unit 14 is supplied with the ozone gas "d" that has been generated by the ozone gas production unit 13, at a flow rate of about 50 g/hr. In the ozone gas production unit 13, the hydrogen gas generated by the cathode electrode 27 is once stored in the cathode chamber 29 and then exhausted to the outside via the hydrogen gas exhaust pipe 33. Further, the ozone gas "d" that has been generated by the anode electrode 26 is once stored in the anode chamber 30 and then introduced into the ozone water production unit 14 via the ozone gas exhaust pipe 32.

The solvent added ultra-pure water "c" that is introduced into the ozone water production unit 14 is forwarded through the interior of the plurality of hollow fiber modules 51, while providing the atmosphere of ozone gas "d" for the outside of the respective hollow fiber modules 51, thereby allowing the solvent added ultra-pure water "c" flowing through the hollow fiber modules 51 to be formed into the ultra-pure ozone water "e" containing the ozone gas "d" that has been dissolved therein.

Then, thus obtained ultra-pure ozone water "e" flows from the ozone water production unit 14 through the ozone water supply pipe 52 and through the discharge nozzle 54 disposed in the bottom of the cleaning bath 15 into the cleaning bath 15 with the aid of a feed force from the supply source. In this flow, the semiconductor substrate that has been dipped in the cleaning bath 15 can be cleaned with the ultra-pure ozone water "e".

Thus, even in the ultra-pure ozone water "e" whose total organic carbon amount has been once reduced extremely, the reduction of the half-life period of ozone can be suppressed by adding the organic solvent "b" composed of highly purified isopropyl alcohol to the ultra-pure ozone water "e". It is believed that the reason for this is because although the most part of organic carbon capable of suppressing the autolysis of ozone has been decomposed during the production process of the ultra-pure water "a" by the ultraviolet ray irradiated to the ultra-pure water "a", it can be supplemented with the organic solvent "b" which is added in the solvent adding unit 12.

Accordingly, it is ensured that the ultra-pure ozone water "e" containing the highly concentrated ozone is supplied into the cleaning bath 15. This, with the aid of the strong oxidizing effect from the ozone, may help enhance the cleaning capability as well as the cleaning efficiency on the organic impurities and the metallic impurities adhering to the semiconductor substrates.

Further, since the present invention has employed the adding method using the porous polymer membrane filter 20 having water repellency as the adding method of the organic solvent "b" to the ultra-pure water "a", a trace amount of organic solvent "b" can be accurately added into the ultra-pure water "a". That is, the present invention can solve the possible problem of contamination of the ultra-pure water "e" with the organic carbon, which could be otherwise induced by the excessive addition of the organic solvent "b". Further advantageously, the present invention can solve the problem of the excessive amount of organic carbon that would adhere to the surface of the semiconductor substrate and thereby deteriorates the substrate characteristics of the semiconductor substrate. Still further, it can eliminate an occurrence of an inverse effect from the excessive supply of the organic carbon to the ozone water production unit 14 (e.g., the deterioration in the electrode due to the impurities that has been get mixed therein). Yet further, the fact that the organic solvent "b" is to be added by an extremely trace amount can eliminate the need for an explosion-proof apparatus specified under the Fire Service Law of Japan to be installed.

Herein, in an actual practice, isopropyl alcohol (having the metallic impurities concentration not greater than 0.5 ppb) is used as the organic solvent "b", and the addition amount thereof is adjusted to make the resultant concentration meet a target value. A report is made on the results of measurements of (A) the dissolved ozone concentration in the ultra-pure ozone water "e" immediate after its generation by the ozone water production unit 14 during the above process and (B) the dissolved ozone concentration in the ultra-pure ozone water "e" at the cleaning bath 15, respectively, with an added amount of the organic solvent "b" taken as a parameter. The ultraviolet ray absorption method was employed for measuring the ozone concentration. Further, the total organic carbon amount on the surface of the semiconductor substrate at the time of the measurement was measured in accordance with the substrate temperature rise desorption mass spectrometry. The results on the above measurements are indicated in Table 1.

TABLE 1

| Organic solvent | Dissolved ozone concentration (mg/l) | | Residual carbon component/ Deterioration in Substrate characteristics |
|---|---|---|---|
| | (A)Ozone water production unit | (B)Cleaning bath | |
| Nil | 24.1 | 3.5 | Nil |
| Add. by 0.1 μg/l | 24.6 | 7.5 | Nil |
| Add. by 1 μg/l | 23.2 | 13.7 | Nil |
| Add. by 5 μg/l | 25.7 | 18.4 | Nil |
| Add. by 100 μg/l | 24.0 | 20.2 | Nil |
| Add. by 1 mg/l | 23.8 | 21.6 | Nil |
| Add. by 10 mg/l | 24.8 | 22.1 | With residual carbon component |
| Add. by 100 mg/l | 23.5 | 22.8 | With increment of residual carbon component |
| Add. by 1 g/l | 22.9 | 22.3 | Deteriorated substrate characteristics observed |

As apparent from Table 1, it has been found that when the organic solvent "b" is added by an extremely trace amount of 0.1 μg/liter, the half-life period of dissolved ozone is extend to some degree as compared to the case without any addition of the organic solvent. Further, as the addition amount of the organic solvent is increased to 5 μg/liter, 100 μg/liter and finally 1 mg/liter, (B) the dissolved ozone concentration in the ultra-pure ozone water "e" at the cleaning bath 15 increases and reaches to a level where it is almost the same as (A) the dissolved ozone concentration of the ultra-pure ozone water "e" immediate after its generation by the ozone water production unit 14. This indicates that the dissolved ozone concentration is maintained without great reduction.

However, when the addition amount is increased up to 10 mg/liter, the organic carbon (carbon component) starts to remain on the surface of the semiconductor substrate, which is considered resultant from the organic solvent "b". Further, with the addition amount of 100 mg/liter, the residual carbon amount was increased greater as compared to the case of the addition amount of 10 mg/liter, but the substrate characteristics of the semiconductor substrate was not deteriorated. However, the deterioration in the substrate characteristics possibly due to the residual organic solvent "b" was observed for the addition amount of 1 g/liter. It has been found from the evaluation on the dissolved ozone concentration and the residual carbon amount that the addition amount of the organic solvent "b" to the ultra-pure water "a" in a range of 0.1 μg/liter to 100 mg/liter should be preferred. It has been further found that most preferably, the addition amount of the organic solvent should be in a range of 5 μg/liter to 1 mg/liter.

Figure 5:
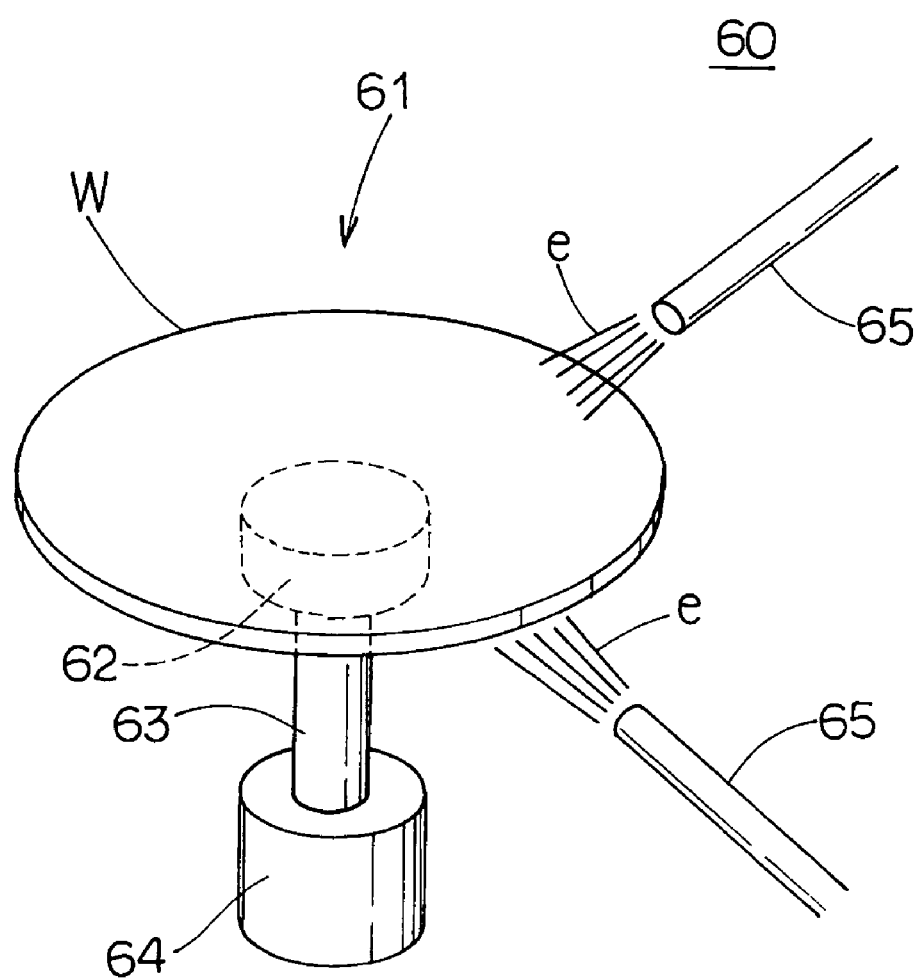
FIG. 5 is a perspective view of a spinning-type single wafer cleaning unit employed in a semiconductor substrate cleaning apparatus according to a second embodiment of the present invention, illustrating its operating condition.

Turning now to FIG. 5, a semiconductor substrate cleaning apparatus according to a second embodiment of the present invention will be described.

As shown in FIG. 5, the semiconductor substrate cleaning apparatus 60 represents an example employing a spinning-type single wafer cleaning unit 61 substituting for the cleaning bath 15 in the first embodiment.

The spinning-type single wafer cleaning unit 61 comprises a retainer plate 62 for retaining a semiconductor substrate W by means of vacuum chuck, a rotary motor 64 for rotating the retainer plate 63 via a revolving shaft 63, and a pair of upper and lower injection nozzles 65, 65 for injecting the ultra-pure ozone water "e" obtained from the apparatus of the first embodiment.

In the cleaning operation, firstly the semiconductor substrate W is vacuum-chucked on the retainer plate 62 and then rotated along with the retainer plate 62 at a revolving speed of 500 rpm by the rotary motor 64. During this rotation, the ultra-pure ozone water "e" is injected from the pair of upper and lower injection nozzles 65, 65 toward central regions of the top and the back surfaces of the semiconductor substrate W at a flow rate of 1.0 liter/min. This allows both the top and the back surfaces of the semiconductor substrate W to be cleaned with the ultra-pure ozone water "e".

Since the rest parts of the configuration, operation and effect in this example are identical to those in the first embodiment, the further explanation should be herein omitted.

Herein, the comparison was made between (A) the dissolved ozone concentration in the ultra-pure ozone water "e" immediate after its generation by the ozone water production unit 14 according to the first embodiment and (C) the dissolved ozone concentration in the ultra-pure ozone water "e" injected from the injection nozzles 65, 65, for the cases of with and without addition of the organic solvent "b". It is to be noted that the addition amount of the organic solvent "b" was selected to be 50 μg/liter in this example. The same ultraviolet ray absorption method as that used in the first embodiment was employed to measure the ozone concentration. The test condition was as follows.

In specific, a semiconductor substrate W which has been treated in advance with dilute hydrofluoric acid to have a hydrogen terminated silicon surface was used, and the wafer W was vacuum-chucked on the retainer plate 62. Then, the semiconductor substrate W together with the retainer plate 62 as one unit was spun at a revolving speed of 500 rpm. During this spinning, the ultra-pure ozone water "e" was supplied toward the central regions of the semiconductor substrate W from both upper and lower injection nozzles 65, 65 continuously only for about three seconds. At that time, a contact angle of the ultra-pure ozone water "e" on the surface of the semiconductor substrate W was measured. The contact angle is defined by an angle formed between a water drop and the substrate surface when the water drop (the ultra-pure ozone water "e") drops on the surface of the semiconductor substrate W. The surface of the semiconductor substrate W that has been treated to have a hydrogen terminated silicon surface tends to repel water. Owing to this, it has a larger contact angle. In contrast to this, in the semiconductor substrate whose surface has been cleaned with the ultra-pure ozone water "e" (i.e., ozone treatment), the oxidation on the substrate surface is stimulated and thus the contact angle becomes smaller.

Table 2 indicates the dissolved ozone concentrations (A), (C) as well as the contact angles measured in the central region and the peripheral region of the semiconductor substrate W.

As can be seen from Table 2, it is apparent that (C) the dissolved ozone concentration in the ultra-pure ozone water "e" injected from the injection nozzles 65, 65 is higher in the case with the organic solvent "b" added to the ultra-pure ozone water "e" than in the case with no organic solvent "b" added thereto, similarly to the first embodiment.

Then a comparison was made on the contact angles of the ultra-pure ozone water "e" on the surface of the semiconductor substrate W. It has been found that there is substantially no difference between the ultra-pure ozone waters "e" with and without the addition of the organic solvent "b" in the central region of the semiconductor substrate subject to the direct application of the ultra-pure ozone water "e" injected from the injection nozzle 65, where the ozone oxidation has developed in either case. In contrast to this, it has been found that there is great difference in the periphery of the semiconductor substrate W, that is, the contact angle in the periphery was greater than that in the central region of the semiconductor substrate W in the case with no organic solvent "b" added to the ultra-pure ozone waters "e", which means an insufficient oxidation in the periphery.

That is, it is thought that in the spinning cleaning with the ultra-pure ozone water containing no organic solvent according to the prior art, there is no sufficient amount of ozone remaining to allow the ozone oxidation to take effect up to the periphery of the semiconductor substrate, after the ultra-pure ozone water supplied to the central region of the semiconductor substrate having oxidized the central region of the semiconductor substrate. There is a fear that if there is uneven oxidation occurring in the surface of such a semiconductor substrate, it could lead to particle contamination in the periphery of the semiconductor substrate, which has not been oxidized sufficiently. In contrast to this, it has been realized that in the spinning cleaning using the ultra-pure ozone water "e" containing the organic solvent "b" of the second embodiment, the dissolved ozone concentration is high, and so only the cleaning period as long as three seconds can provide sufficient oxidation entirely across the surface of the semiconductor substrate W up to the periphery thereof, thus enhancing the cleaning capability.

TABLE 2

| Organic solvent | Dissolved ozone concentration (mg/l) | | Contact angle (degree) | |
| --- | --- | --- | --- | --- |
| | (A)Ozone water production unit | (C)Injection nozzle | Center of substrate | Periphery of substrate |
| Nil | 27.8 | 6.2 | <4 | 32 |
| Add. by 50 μg/l | 25.3 | 20.6 | <4 | <4 |

Figure 6:
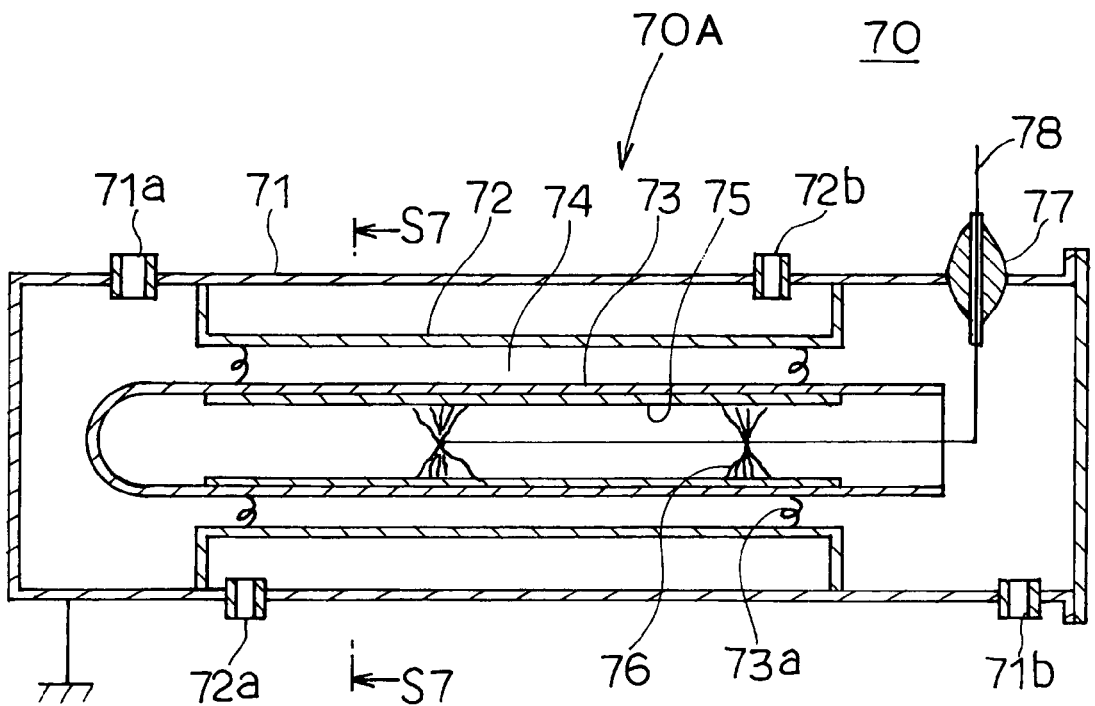
FIG. 6 is a longitudinal sectional view of an ozone gas production unit employed in a semiconductor substrate cleaning apparatus according to a third embodiment of the present invention.
Figure 7:
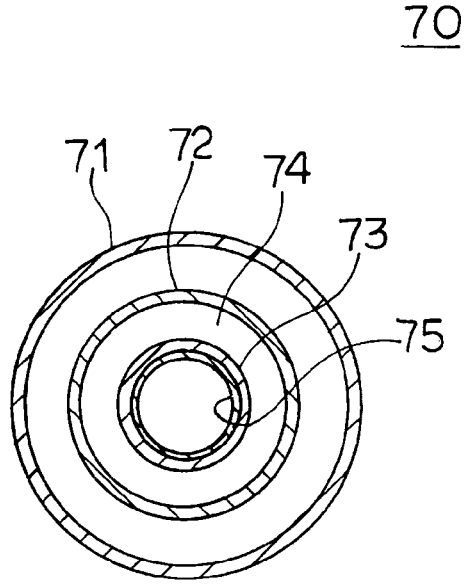
FIG. 7 is a sectional view taken along the S7-S7 line of FIG. 6.

With reference to FIGS. 6 and 7, a third embodiment of the present invention will now be described.

A semiconductor substrate cleaning apparatus 70 shown in FIGS. 6 and 7 illustrates an example employing a silent discharge process type ozone gas production unit instead of the electrolytic process type ozone gas production unit of the first embodiment.

An ozone gas production unit 70A as shown in FIGS. 6 and 7 comprises an elongated can body 71 extending along its axial direction, defining a main body thereof. A source gas inlet 71a for introducing the air provided as a source gas is formed in one end of an outer shell of the can body 71. Further, an ozone gas outlet 71b for exhausting the obtained ozone gas "d" is formed in the other end of the outer shell of the can body 71.

Still further, a water jacket 72 is arranged within the can body 71 extending along its length except opposite ends thereof with the outer shell of the can body 71 serving as an outer wall for the water jacket 72. A cooling water inlet 72a for introducing a cooling water is formed in one end of the water jacket 72 and a cooling water outlet 72b is formed in the other end of the water jacket 72.

A high voltage electrode tube 73 of test tube shape is contained in a central location of the can body 71, which extends along the axial line of the can body 71 and is open to the other end side of the can body 71. The high-voltage electrode tube 73 employs a dielectric material including glass as its raw material. The high voltage electrode tube 73 forms a predetermined discharge cavity 74 defined between the electrode tube 73 and the water jacket 72 via a plurality of spacers 73a . . . located between the electrode tube 73 and an inner wall in opposite ends of the water jacket 72. Further, a conducting film 75 is formed on the inner surface of the high voltage electrode tube 73.

Feeders 76 . . . are disposed in the vicinity of opposite ends of the conducting film 75 for applying an alternate high voltage to the conducting film 75. Each of the feeders 76 . . . is connected with a head portion of a feeding line 78 introduced from the outside passing through a bushing 77 disposed in the other end of the can body 71.

A generation process of the ozone gas "d" by this silent discharge type ozone gas production unit 70A will now be described. When an alternate high voltage is applied to the conducting film 75 of the high voltage electrode tube 73, a moderate glow discharge referred to as a silent discharge is induced in the discharge cavity 74. This causes the ozonization in the source gas, which has been introduced into the can body 71 from the source gas inlet 71a, to form the ozone gas "d". Then, thus obtained ozone gas "d" is supplied through the ozone gas outlet 71b into the ozone water production unit 14. A heat generation takes place in the discharge cavity 74 by the electric discharge. If the heat generation is left as it is, then the gas temperature in the discharge cavity 74 rises, and the ozone generation is suppressed. From this reason, a flow of cooling water is introduced into the water jacket 72 by using the cooling water inlet 72a and the cooling water outlet 72b so as to cool the gas flowing through the discharge cavity 74.

The rest parts of the configuration, action and effect are the same as those in the first embodiment, and the explanation thereof should be herein omitted.

As having been described above, according to the ozone water for use in cleaning semiconductor substrates, the production method of the ozone water for use in cleaning semiconductor substrates and the cleaning method of the semiconductor substrates of the present invention, by adding the organic solvent to the ozone water, even such an ozone water having a reduced total organic carbon amount, especially the ozone water that has been obtained from an ultra-pure water having an extremely small total organic carbon amount, still can suppress the reduction of the half-life period of ozone. Consequently, if this ozone water for use in cleaning semiconductor substrates of the present invention is employed as a cleaning fluid for the semiconductor substrates, the highly enriched ozone water is reliably supplied to a cleaning unit. This, owing to the strong oxidizing action from the ozone, can enhance the cleaning capability and the cleaning efficiency on any organic impurities and metallic impurities adhering to the semiconductor substrates.

Especially, according to the production method of the ozone water for use in cleaning semiconductor substrates, and the cleaning method of the semiconductor substrates of the present invention, if such a method for adding the organic solvent to the water is employed, in which a porous polymer membrane having water repellency is used therefor, a trace amount of organic solvent can be added precisely to the water. It means that there should be no more such an event that the ozone water would be contaminated with an amount of organic carbon added excessively by the organic solvent or that the carbon component would exist on the surface of the semiconductor substrate which otherwise could cause the deterioration of the substrate characteristics. Further advantageously, the present invention can eliminate any inverse affection from the excessive amount of organic carbon on the ozone gas generator in the ozone water production unit. Still further, since only the extremely trace amount of organic solvent is added according to the present invention, the need for an explosion-proof apparatus required under the Fire Service Law of Japan should be eliminated.

EFFECT OF THE INVENTION

As apparent from the above description of the present invention, the technique on ozone water for use in cleaning semiconductor substrate according to the present invention may be applicable to the cleaning of a silicon wafer or a gallium arsenide wafer in the form of single wafer, for example. The present invention may be further applicable to the cleaning of such a bonded substrate comprising two pieces of semiconductor substrates that have been bonded one on the other (including a bonded SOI substrate). Especially, the present invention is extremely effective to extend the half-life period of ozone for an ultra-pure ozone water whose total organic carbon amount has been reduced.

What is claimed is:

1. A production method for an ozone water for use in cleaning semiconductor substrates, comprising adding ethanol or isopropyl alcohol, which suppresses a reduction of the half-life of ozone, to ultra-pure water through a porous polymer membrane having water repellency and subsequently dissolving ozone in the ultra-pure water to which the ethanol or isopropyl alcohol has been added.

2. A production method for an ozone water for use in cleaning semiconductor substrates in accordance with claim 1, wherein said porous polymer membrane is a membrane formed from a tetrafluoroethylene resin.

3. The production method for an ozone water for use in cleaning semiconductor substrates in accordance with claim 2, wherein in an enclosed cell in which a primary chamber is separated from a secondary chamber by interposition of said porous polymer membrane, said ethanol or isopropyl alcohol is supplied to the primary chamber and the ultra pure water is supplied to the secondary chamber whereby said ethanol or isopropyl passes through the porous polymer membrane and is added to said ultra-pure water.

4. A production method for an ozone water for use in cleaning semiconductor substrates in accordance with claim 3, in which said ethanol or isopropyl alcohol is added to said ultra-pure water in an amount of 5 µg/liter to 1 mg/liter of the ultra-pure water.

5. A production method for an ozone water for use in cleaning semiconductor substrates in accordance with claim 4, wherein in the step of dissolving ozone in the ultra-pure water to which the ethanol or isopropyl alcohol has been added, the ultra-pure water to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

6. A production method for an ozone water for use in cleaning semiconductor substrates in accordance with claim 3, wherein in the step of dissolving ozone in the ultra-pure water to which the ethanol or isopropyl alcohol has been added, the ultra-pure water to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

7. A production method for an ozone water for use in cleaning semiconductor substrates in accordance with claim 2, in which said ethanol or isopropyl alcohol is added to said ultra-pure water in an amount of 5 µg/liter to 1 mg/liter of the ultra-pure water.

8. A production method for an ozone water for use in cleaning semiconductor substrates in accordance with claim 7, wherein in the step of dissolving ozone in the ultra-pure water to which the ethanol or isopropyl alcohol has been added, the ultra-pure water, to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

9. A production method for an ozone water for use in cleaning semiconductor substrates in accordance with claim 2, wherein in the step of dissolving ozone in the ultra-pure water to which the ethanol or isopropyl alcohol has been added, the ultra-pure water to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

10. The production method for an ozone water for use in cleaning semiconductor substrates in accordance with claim 1, wherein in an enclosed cell in which a primary chamber is separated from a secondary chamber by interposition of said porous polymer membrane, said ethanol or isopropyl alcohol is supplied to the primary chamber and the ultra pure water is supplied to the secondary chamber whereby said ethanol or isopropyl passes through the porous polymer membrane and is added to said ultra-pure water.

11. A production method for an ozone water for use in cleaning semiconductor substrates in accordance with claim 10, in which said ethanol or isopropyl alcohol is added to said ultra-pure water in an amount of 5 µg/liter to 1 mg/liter of the ultra-pure water.

12. A production method for an ozone water for use in cleaning semiconductor substrates in accordance with claim 11, wherein in the step of dissolving ozone in the ultra-pure water to which the ethanol or isopropyl alcohol has been added, the ultra-pure water to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

13. A production method for an ozone water for use in cleaning semiconductor substrates in accordance with claim 10, wherein in the step of dissolving ozone in the ultra-pure water to which the ethanol or isopropyl alcohol has been added, the ultra-pure water to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

14. A production method for an ozone water for use in cleaning semiconductor substrates in accordance with claim 1, in which said ethanol or isopropyl alcohol is added to said ultra-pure water in an amount of 5 µg/liter to 1 mg/liter of the ultra-pure water.

15. A production method for an ozone water for use in cleaning semiconductor substrates in accordance with claim 14, wherein in the step of dissolving ozone in the ultra-pure water to which the ethanol or isopropyl alcohol has been added, the ultra-pure water to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

16. A production method for an ozone water for use in cleaning semiconductor substrates in accordance with claim 1, wherein in the step of dissolving ozone in the ultra-pure water to which the ethanol or isopropyl alcohol has been added, the ultra-pure water to which the ethanol or isopropyl alcohol has been added is supplied to an inside of a tetrafluoroethylene resin pipe and ozone gas is dissolved in said ultra-pure water to which the ethanol or isopropyl alcohol has been added by providing an ozone gas atmosphere outside of the tetrafluoroethylene resin pipe.

* * * * *